(12) United States Patent
Chen (10) Patent No.: US 7,171,591 B2
(45) Date of Patent: Jan. 30, 2007

(54) METHOD AND APPARATUS FOR ENCODING SPECIAL UNCORRECTABLE ERRORS IN AN ERROR CORRECTION CODE

(75) Inventor: Chin-Long Chen, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 10/744,833

(22) Filed: Dec. 23, 2003

(65) Prior Publication Data

US 2005/0188292 A1   Aug. 25, 2005

(51) Int. Cl.
*G06F 11/00* (2006.01)
(52) U.S. Cl. .......................... 714/52; 714/768
(58) Field of Classification Search .................. 714/52, 714/57, 768, 784, 785, 49, 53, 774
See application file for complete search history.

(56) References Cited

U.S. PATENT DOCUMENTS

| | | | |
|---|---|---|---|
| 4,117,458 A | 9/1978 | Burghard et al. ......... 340/146.1 |
| 4,142,174 A | 2/1979 | Chen et al. .............. 340/146.1 |
| 4,319,357 A * | 3/1982 | Bossen ...................... 714/753 |
| 4,413,339 A * | 11/1983 | Riggle et al. .............. 714/765 |
| 4,464,753 A | 8/1984 | Chen ........................... 371/38 |
| 4,509,172 A | 4/1985 | Chen ........................... 371/38 |
| 4,556,977 A | 12/1985 | Olderdissen et al. .......... 371/37 |
| 4,862,463 A | 8/1989 | Chen ........................... 371/38 |
| 5,425,038 A | 6/1995 | Chen ......................... 371/37.1 |
| 5,537,423 A | 7/1996 | Chen ......................... 371/37.1 |
| 5,600,659 A | 2/1997 | Chen ......................... 371/37.1 |
| 5,745,507 A | 4/1998 | Chen ......................... 371/40.1 |
| 5,754,562 A | 5/1998 | Chen ........................ 371/37.01 |
| 5,805,615 A | 9/1998 | Chen ......................... 371/37.6 |
| 6,282,686 B1 * | 8/2001 | Cypher ....................... 714/758 |

(Continued)

OTHER PUBLICATIONS

"b-Adjacent Error Correction", D. C. Bossen, IBM J. Res. Develop., pp. 402-408, Oct. 1969.

(Continued)

*Primary Examiner*—Nadeem Iqbal
(74) *Attorney, Agent, or Firm*—William A. Kinnaman, Jr.

(57) ABSTRACT

An error correction code for encoding the presence of a special uncorrectable error as well as its type. In the encoder, modification logic modifies the regular data symbols to indicate the type of special uncorrectable error. The encoder appends to the regular data symbols a special uncorrectable error symbol indicating the presence of a special uncorrectable error to form an extended data word, which is encoded to generate a code word. In the decoder, a syndrome generator generates a syndrome vector using an assumed value for the special uncorrectable error symbol indicating the absence of a special uncorrectable error, while a syndrome decoder determines the presence of the special uncorrectable error by determining the presence of an error in the assumed value of the special uncorrectable error symbol. By so using its error detection logic, the decoder makes it unnecessary to actually store or transmit the special uncorrectable error symbol.

17 Claims, 6 Drawing Sheets

U.S. PATENT DOCUMENTS

| | | | | |
|---|---|---|---|---|
| 6,457,154 | B1 | 9/2002 | Chen et al. | 714/768 |
| 6,519,736 | B1 * | 2/2003 | Chen et al. | 714/768 |
| 6,606,727 | B1 * | 8/2003 | Yang et al. | 714/774 |
| 6,625,774 | B1 * | 9/2003 | Yang | 714/755 |
| 2001/0025359 | A1 * | 9/2001 | Tanaka | 714/753 |
| 2002/0152444 | A1 | 10/2002 | Chen et al. | 714/785 |
| 2002/0188909 | A1 | 12/2002 | Chen | 714/785 |
| 2003/0093450 | A1 | 5/2003 | Chen | 708/492 |

OTHER PUBLICATIONS

"Error-Correcting Codes", Peterson and Weldon, 2nd Edition, 1972, pp. 40-47; 52-59; 117-120; 269-305; 472-476; and 493-499.

* cited by examiner

METHOD AND APPARATUS FOR ENCODING SPECIAL UNCORRECTABLE ERRORS IN AN ERROR CORRECTION CODE

CROSS-REFERENCE TO RELATED APPLICATIONS

This application is related to the commonly owned, concurrently filed application of the same inventor, Ser. No. 10/744,564, entitled "(18, 9) Error Correction Code for Double Error Correction and Triple Error Detection".

BACKGROUND OF THE INVENTION

1. Field of the Invention

This invention relates, in general, to error correction codes for computers and data communications, and in particular to a special coding for encoding special uncorrectable errors for computer failure isolation.

2. Description of the Related Art

Error correction codes (ECCs) have long been used in computers as well as data communications. Typically, such codes are constructed by appending r=n−k check symbols to k message symbols to form an n-symbol code word, using a linear matrix transformation of the form:

$$C=MG,$$

where $C=(c_0, c_1, \ldots, c_{n-1})$ is a 1×n row vector representing the n-symbol code word, $M=(m_0, m_1, \ldots m_{k-1})$ is a 1×k row vector representing the k-symbol message or data word, and G is a k×n matrix known as a generator matrix. (Alternatively, if C and M are assumed to be column vectors, the transformation becomes $C=G^tM$, where $G^t$ is the transpose of G.) Although the symbols need not be bits, they are usually bits, and bits will be referred to in the discussion that follows. The code word C is either written to a storage medium or transmitted over a communication channel. Both the storage medium and the communication channel in the narrow sense may be regarded as "communication channels" in the broad sense.

On the decoding side, an n-bit word R is either retrieved from a storage medium or received over a communication channel. This word R is the sum of the originally generated code word C and an n-bit error word E (which may be zero) representing any errors that may have occurred. To determine whether the received word accurately represents the original code word C, the received word R is used to generate a k-bit syndrome vector using a matrix transformation of the form:

$$S=RH^t,$$

where S is the syndrome vector and $H^t$ is the transpose of an r×n matrix H known as a parity check matrix. (Alternatively, if S is assumed to be a column vector, the transformation becomes $S=HR^t$, where $R^t$ is the transpose of R.)

The parity check matrix H is selected so that its row vectors lie in the null space of those of the generator matrix G (i.e., $GH^t=0$), so that for an original code word C, $$CH^t=0.$$

Since R=C+E, $$S=(C+E)H^t=CH^t+EH^t=0+EH^t=EH^t.$$

In other words, the syndrome vector S is independent of the original code word C and a function only of the error word E. The decoder uses the syndrome vector S to reconstruct the error word (following maximum likelihood criteria), which is subtracted from the received word R to regenerate the code word C.

A code is the set of code words C generated from a given set of data words M. (Even if two generator matrices differ, their code spaces may be the same.) Codes are commonly classified by the number of symbols in their data word M and code word C. Thus, an (n, k) code has a code word of n symbols generated on a data word of k symbols.

The ability of a code to detect and correct errors depends on the so-called Hamming distance between different code words of the code. In general, the Hamming distance between two code words is the number of symbols in which the two code words differ. If the minimum Hamming distance of a code is t+1, then the code can detect up to t errors, since if the code word has t or fewer errors, it will not have changed into any other code word. Similarly, if the minimum Hamming distance of a code is 2t+1, the code can correct up to t errors, since a received word having t or fewer errors will be within a Hamming distance of t symbols on one and only one code word, and thus can be unambiguously decoded as that code word.

Furthermore, if the minimum Hamming distance of a code is 2t+2, the code can correct up to t errors and also can detect t+1 errors, since a received word having t+1 errors will not be within a Hamming distance of t symbols from any code word and thus will be detected as having uncorrectable errors (UEs). From the foregoing, it will be apparent that to correct 2 or fewer errors and simultaneously detect 3 errors, a code must have a minimum Hamming distance of 6 symbols. Such codes are commonly referred to as double error correcting and triple error detecting (DEC-TED) codes. To give another example, codes with a minimum Hamming distance of 4 symbols can correct a single error and detect up to 2 errors, and are known as single error correcting and double error detecting (SEC-DED) codes.

Single error correcting and double error detecting (SEC-DED) codes have been widely used to protect computer memory subsystems from failures. As certain critical data such as storage protection keys in computers requires a higher level of error protection, SEC-DED codes may not be adequate. In this case, a double error correcting, triple error detecting (DEC-TED) code may be desired.

Error correction codes capable of correcting double errors and detecting triple errors can be constructed based on the well-known BCH (Bose-Chaudhuri-Hocquenghem) theory (see W. Peterson and E. J. Weldon Jr., *Error-Correcting Codes*, 1972, MIT Press). A primitive BCH DEC-TED code of length $n=2^m-1$ with 2m+1 check bits is obtained with a parity check matrix, each column vector k of which consists of 1, $\alpha^k$ and $\alpha^{3k}$, where $\alpha$ is a primitive element of the finite field of $2^m$ elements. Olderdissen describes a rapid decoding of the primitive BCH DEC-TED codes in U.S. Pat. No. 4,556,977. On the other hand, a non-primitive BCH DEC-TED code of length $n=2^m+1$ with 2m+1 check bits can be obtained with a parity check matrix, each column vector k of which consists of 1 and $\beta^k$, where $\beta$ is a primitive root of $x^n-1$ in the finite field of $2^{2m}$ elements. A non-primitive BCH DEC-TED code provides two more data bits than a BCH DEC-TED code with the same number of check bits. One drawback of the Olderdissen decoding scheme is that it is not applicable to non-primitive BCH DEC-TED codes. In U.S. Pat. No. 4,117,458, Burghard and Coletti describe a decoding scheme based on a brute force table-look-up approach for a non-BCH code of length 17 ($=2^4+1$) with 8 data bits and 9 check bits. In addition, their error detection scheme is limited to triple errors. The decoding table does not detect multiple errors beyond three that are theoretically detectable.

Recent ECC design for computer applications requires the ability to detect memory address errors as well as the ability to isolate component failures with invalid data indicators (see for examples U.S. Pat. No. 6,457,154 for memory address error detection and U.S. Pat. No. 6,519,736 for failure isolation of computer components with invalid data indicators). For memory address error detection, extra data bits are required for encoding the parity of a memory address. A special data invalid indicator, also known as a special UE (SPUE) indicator, is generated when the data sent out of a particular computer component to the memory is known to be bad. As the special UEs come from different computer components, it is desirable to be able to identify the source that generates a particular special UE when the data associated with the special UE is fetched from the memory. To meet this requirement, extra data bits are also required for the encoding of the special UEs. In the prior art, a plurality of data bits are reserved for multiple special UEs, which is inefficient in the usage of ECC data bits, especially when the number of available ECC data bits is limited.

SUMMARY OF THE INVENTION

The present invention contemplates a method and apparatus for encoding special uncorrectable errors in an information handling system. The system is one in which a data word that is susceptible to a plurality of types of special uncorrectable errors and contains a plurality of regular data symbols that are used to encode data in the absence of a special uncorrectable error is encoded using an error correction code to generate a code word. In accordance with the invention, in the encoder, the regular data symbols are modified in the presence of a special uncorrectable error to indicate the type of special uncorrectable error. A special uncorrectable error symbol indicating the presence of a special uncorrectable error is appended to the regular data symbols to form an extended data word, which is encoded to generate a code word. By modifying the regular data symbols in this manner to indicate the type of special uncorrectable error, the present invention makes it unnecessary to use additional special uncorrectable error symbols for this purpose.

The regular data symbols and the uncorrectable error symbol are typically bits, and the code word is typically generated by generating one or more check symbols as a function of the symbols of the extended data word and appending the check symbols to the extended data word to form the code word. The extended data word may also contain an address parity symbol indicating the parity of a memory address in which the data is stored.

The code word is decoded to regenerate the special uncorrectable error symbol and the modified regular data symbols. Preferably, the decoder decodes the code word using an assumed value for the special uncorrectable error symbol indicating the absence of a special uncorrectable error, and detects the presence of an error in the assumed value of the special uncorrectable error symbol to regenerate that symbol. More particularly, in the decoder, a syndrome generator would generate a syndrome vector from the code word using an assumed value for the special uncorrectable error symbol indicating the absence of a special uncorrectable error. A syndrome decoder would then detect the presence of an error in this assumed value from the syndrome vector to detect presence of a special uncorrectable error. By using its error detection logic in this manner, the decoder makes it unnecessary to actually store or transmit the special uncorrectable error symbol.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
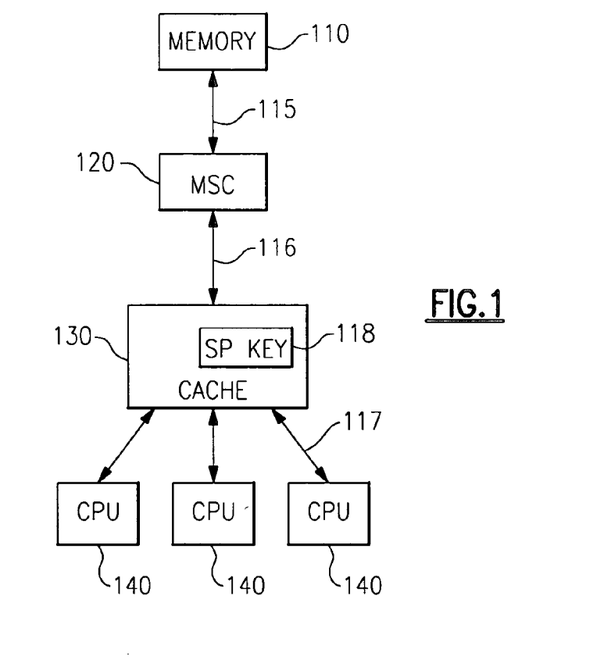
FIG. 1 illustrates one example of a computer system in which error correction and error detection in accordance with the principles of the present invention may be utilized.

FIG. 1 is a block diagram representation of one embodiment of a computer system 100 utilizing the error correction code of the present invention. In the embodiment shown, computer system 100 includes a memory 110 connected to a main storage controller (MSC) 120 via a data bus 115, a cache 130 connected to MSC 120 via an MSC-cache interface 116, and a plurality of central processing units (CPUs) 140 connected to cache 130 via data buses 117. MSC-cache interface 116 and data buses 117 are used to transfer data between MSC 120 and cache 130 and between cache 130 and CPUs 140, respectively. Transfer of data between memory 110 and MSC 120, on the other hand, occurs via data bus 115. Thus, data bus 115 facilitates the reading of data from memory 110 as well as the writing of data to memory 110 by MSC 120.

A subset of the data area in cache 130 is a storage protection key area (SP KEY) 118, which contains storage protection keys generated to assure data integrity in the cache. In accordance with the present invention, storage protection keys from key area 118 are constantly updated and stored in memory 110, as is all data from the cache 130. However, because storage protection keys are considered critical data that require a higher level of reliability, a more potent ECC is selected for error protection of these keys. In particular, a DEC-TED code is used to correct all single or double errors, detect all triple errors and also detect a plurality of multiple errors in an encoded ECC word, as described further below.

In the embodiment shown, a storage protection key consists of 7 bits. In addition, one data bit is used for encoding of the memory address parity, while another data bit is used for encoding of two special uncorrectable errors (UEs). Thus, a total of 9 data bits are required for the ECC. This leads to an (18, 9) DEC-TED code that consists of 18 bits in a code word with 9 data bits and 9 check bits. Note that a special UE (SPUE) is a data validity indicator generated when the data sent out of a particular computer component to the memory is known to be bad. As the special UEs come from different computer components, it is desirable to be able to identify the source that generates a particular special UE when the data associated with the special UE is fetched from the memory.

Figure 2:
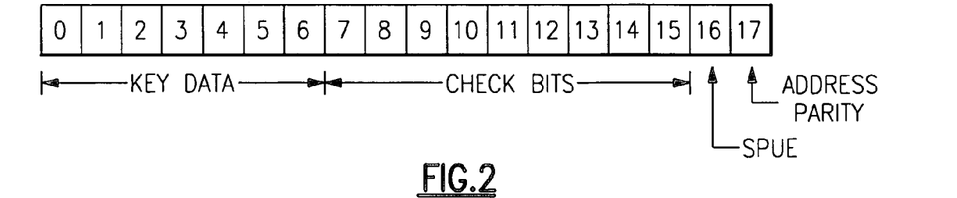
FIG. 2 illustrates one example of an error correction code format for memory address error detection and component failure isolation in accordance with the present invention.

FIG. 2 shows the ECC word structure according to one embodiment of the invention. The first 7 bits (bits 0–6) contain the original storage protection key data. The next 9 bits (bits 7–15) are check bits generated from bits 0–6 and bits 16–17 according to the ECC equations to be described shortly. Bit 16 (SPUE) is assigned for special UEs. Finally, an address parity bit AP (bit 17) is assigned for the parity of the memory address. Only the first 16 bits (bits 0–15) are stored in memory 110 (FIG. 1). Though bits 16 and 17 are used in the generation of check bits, they are not stored in memory 110. In reading data from memory 110, the address parity bit AP is made available to the ECC decoder, while the value of the SPUE bit is assumed to be zero. If, however, the syndrome decoder to be described detects an error at bit location 16 (assuming a bit value of zero at that location), then it determines that the SPUE bit is one and that bits 0–6 encode a SPUE. Thus, even though the SPUE bit is not stored as such, it is effectively encoded in the 16 bits of the code word that are stored in memory 110 through its use in generating the check bits 7–15.

The value of the SPUE bit is 0 for a valid storage protection key. A key is marked invalid when the data received from other components of the computer system is known to be bad. In such case, the value of SPUE is set to 1. Conventionally, plural data bits are used in order to differentiate the sources of the bad data. In the present invention, by contrast, only one data bit (bit 16) is used. To identify the source of the bad data, the associated key data bits (bits 0–6) are modified so that different sources of bad data are represented by different pattern of bits 0–6. For example, to differentiate bad data from cache 130 from bad data from MSC 120 (FIG. 1), two 7-bit patterns (0000000) and (1111111) can be assigned to bits 0–6 (FIG. 2). As an illustration, (0000000) may be assigned to be the pattern of bits 0–6 and SPUE bit 16 set to 1 if the bad data originated from cache 130, while (1111111) may be assigned to be the pattern of bits 0–6 and SPUE bit 16 set to 1 if the bad data originated from MSC 120. Other possible pattern pairs are (1010101, 0101010) and (0001111, 1110000).

Now suppose that one of the SPUE patterns is stored in memory 110 and then retrieved. In accordance with the ECC decoding method to be described, if there is no error in the memory, a unique error syndrome 010001111 is generated and the ECC decoding flags bit 16 to be in error. This indicates that the data received is associated with a SPUE. The pattern in bits 0–6 is then used to identify the original source of bad data. If there is an error in the memory in which the SPUE data resided, the ECC decoding would detect the presence of two errors, one of which is a memory error and the other of which is bit 16. The error syndrome depends on the location of the memory error. In any case, the syndrome is a double error syndrome and will be decoded as such because the code is capable of correcting double errors. Again, upon the error detection of bit 16 the source of the bad data can be isolated.

An ECC can be specified by a set of equations that all encoded ECC words have to satisfy. Let $C=(c_0, c_1, c_2, \ldots, c_{17})$ be a $1\times 18$ row vector defining a code word. The (17, 8) DEC-TED code described in U.S. Pat. No. 4,117,458 is a non-primitive BCH code that can be lengthened by one bit to yield a (18, 9) DEC-TED code. Including the all-one 18-bit vector in the code space does this. The (18, 9) DEC-TED code of the present invention is defined by the following two equations:

$$c_0\beta^3+c_1\beta^6+c_2\beta^{12}+c_3\beta^7+c_4\beta^{14}+c_5\beta^{11}+c_6\beta^5+c_7\beta+c_8\beta^2+\\c_9\beta^4+c_{10}\beta^8+c_{11}\beta^{16}+c_{12}\beta^{15}+c_{13}\beta^{13}+c_{14}\beta^9+c_{15}0+\\c_{16}\beta^{10}+c_{17}\beta^0=0$$

$$c_0+c_1+c_2+c_3+c_4+c_5+c_6+c_7+c_8+c_9+c_{10}+c_{11}+c_{12}+c_{13}+\\c_{14}+c_{15}+c_{16}+c_{17}=0$$

The additions in the above equations are performed according to the rules of the finite field of 256 elements. The first equation specifies the (17, 9) code listed on page 494 of the above-identified work of Peterson et al. and guarantees that the number of nonzero terms is at least 5 for a nonzero code word. The second equation says that the number of nonzero terms in a code word is even, since each $c_i$ is binary. As explained on page 119 of the same work, combining both equations means that the number of nonzero terms of a nonzero code word is at least 6, i.e., the Hamming distance of the code is 6. Note that the first equation involves all 17 unique powers of $\beta$. In this first equation, the terms of the powers of $\beta$ are not arranged in a sequential order. However, the ordering is not critical; any ordering works.

The symbol $\beta$ in the above equations is a primitive root of $x^{17}-1$ in the finite field of 256 elements. Specifically, $\beta=\alpha^{15}$, where $\alpha$ is a root of the binary primitive polynomial $x^8+x^7+x^6+x+1$. The same code space can be defined using an irreducible polynomial. However, in practical application, the particular choice presented here has been empirically shown to lead to a simpler implementation. Notice that $\alpha$ is primitive element of the finite field of 256 elements, and $\beta$ is also an element of the same finite field.

The above equations that define the ECC can be expressed in matrix form as $CH^t=0$, where $H^t$ denotes the transpose of the matrix H:

$$\begin{array}{cccccccccccccccccc} \beta^3 & \beta^6 & \beta^{12} & \beta^7 & \beta^{14} & \beta^{11} & \beta^5 & \beta^1 & \beta^2 & \beta^4 & \beta^8 & \beta^{16} & \beta^{15} & \beta^{13} & \beta^9 & 0 & \beta^{10} & 1 \\ 1 & 1 & 1 & 1 & 1 & 1 & 1 & 1 & 1 & 1 & 1 & 1 & 1 & 1 & 1 & 0 & 1 & 1. \end{array}$$

It can be shown that the code defined by matrix H is a DEC-TED code. In addition, the columns of the matrix can be permuted in any order without reducing the capability of error correction and error detection.

The finite field elements in matrix H can be expressed in binary vectors to facilitate implementation using digital circuitry. Specifically, matrix H can be transformed into a 9×18 binary matrix $H_1$:

$$\begin{array}{cccccccccccccccccc} 0 & 0 & 1 & 1 & 1 & 0 & 1 & 0 & 0 & 0 & 0 & 1 & 1 & 1 & 0 & 0 & 0 & 1 \\ 0 & 0 & 0 & 0 & 1 & 1 & 1 & 1 & 0 & 1 & 0 & 0 & 0 & 0 & 0 & 0 & 1 & 0 \\ 1 & 1 & 1 & 0 & 0 & 1 & 0 & 1 & 1 & 0 & 1 & 1 & 1 & 1 & 0 & 0 & 0 & 0 \\ 0 & 0 & 1 & 0 & 1 & 0 & 0 & 1 & 0 & 1 & 0 & 1 & 0 & 0 & 1 & 0 & 0 & 0 \\ 1 & 0 & 0 & 0 & 1 & 0 & 0 & 0 & 0 & 0 & 0 & 1 & 1 & 1 & 1 & 0 & 0 & 0 \\ 0 & 1 & 1 & 0 & 0 & 0 & 1 & 1 & 0 & 0 & 0 & 1 & 1 & 1 & 0 & 0 & 1 & 0 \\ 0 & 0 & 1 & 1 & 0 & 0 & 1 & 1 & 1 & 0 & 1 & 1 & 1 & 0 & 1 & 0 & 1 & 0 \\ 1 & 1 & 1 & 1 & 0 & 1 & 0 & 1 & 1 & 0 & 0 & 0 & 0 & 0 & 0 & 0 & 1 & 0 \\ 0 & 0 & 1 & 0 & 1 & 0 & 1 & 1 & 0 & 1 & 1 & 1 & 0 & 1 & 0 & 1 & 1 & 0. \end{array} \quad (1)$$

The derivation of $H_1$ from H maybe briefly explained. Assume, as before, that $\alpha$ is a root of $x^8+x^7+x^6+x+1$ and $\beta=\alpha^{15}$. Then a power of $\beta$ can be expressed as a polynomial in terms of the powers of $\alpha$. The coefficients of the polynomial are a binary 8-bit vector listed in the first 8 bits of a column vector in the $H_1$ matrix above. Now, the field element 1 corresponds to the 8-bit vector 10000000. The second row of the H matrix above is an all ones vector. It is translated into a 8-row binary matrix with the first row being all ones and the rest of the rows being all zeros, which can be discarded. This explains how the original matrix is translated into a 9-row binary matrix. However, the last row of the $H_1$ matrix above is not all ones. The all ones row vector has been replaced by the sum (exclusive OR) of all 9 row vectors so that each column contains an odd number of ones. If you add all 9 row vectors together, you obtain an all ones vector. There is no difference in the spaces defined by H and $H_1$.

In reading data from the memory, matrix $H_1$ is used to check if an 18-bit received vector R is a legitimate code word by calculating the syndrome S by the formula $S=RH_1^t$, where $H_1^t$ is the transpose of the vector $H_1$. Vector R is assumed to be a code word if the syndrome S is an all zeros vector. If S is not an all zeros vector, the ECC decoder to be described is used to determine if R contains one or two errors and also to determine the associated error positions. The decoder is also used to determine if R contains detectable uncorrectable errors (UEs), which include the set of all triple errors and some higher-order errors that are also detectable, though not correctable. Let $S=(s_0, s_1, s_2, \ldots, s_8)$. The received bits marked with the ones in row i of matrix $H_1$ are summed together using exclusive OR (XOR) operations to obtain the value of $s_i$. Specifically, the syndrome bits are obtained by the following formulas.

$s_0$=XOR of input bits 2, 3, 4, 6, 11, 12, 13, 17

$s_1$=XOR of bits 4, 5, 6, 7, 9, 16

$s_2$=XOR of bits 0, 1, 2, 5, 7, 8, 10, 11, 12, 13

$s_3$=XOR of bits 2, 4, 7, 9, 11, 14

$s_4$=XOR of bits 0, 4, 11, 12, 13, 14

$s_5$=XOR of bits 1, 2, 6, 7, 11, 12, 13, 16

$s_6$=XOR of bits 2, 3, 6, 7, 8, 10, 11, 12, 14, 16

$s_7$=XOR of bits 0, 1, 2, 3, 5, 7, 8, 16

$s_8$=XOR of bits 2, 4, 6, 7, 9, 10, 11, 13, 15, 16.  (2)

Let us label the columns of matrix $H_1$ as columns 0, 1, . . . , 17. For the generation of check bits, $H_1$ is multiplied by the inverse of the matrix formed by its columns 7–15 to obtain the matrix $H_2$.

$$\begin{array}{cccccccccccccccccc} 0 & 1 & 0 & 1 & 1 & 0 & 0 & 1 & 0 & 0 & 0 & 0 & 0 & 0 & 0 & 0 & 1 & 1 \\ 1 & 0 & 1 & 0 & 1 & 1 & 0 & 0 & 1 & 0 & 0 & 0 & 0 & 0 & 0 & 0 & 0 & 1 \\ 0 & 1 & 0 & 1 & 0 & 1 & 1 & 0 & 0 & 1 & 0 & 0 & 0 & 0 & 0 & 0 & 0 & 1 \\ 0 & 0 & 1 & 0 & 1 & 0 & 1 & 0 & 0 & 0 & 1 & 0 & 0 & 0 & 0 & 0 & 1 & 1 \\ 1 & 0 & 0 & 1 & 0 & 1 & 0 & 0 & 0 & 0 & 0 & 1 & 0 & 0 & 0 & 0 & 1 & 1 \\ 1 & 1 & 0 & 0 & 1 & 0 & 1 & 0 & 0 & 0 & 0 & 0 & 1 & 0 & 0 & 0 & 0 & 1 \\ 0 & 1 & 1 & 0 & 0 & 1 & 0 & 0 & 0 & 0 & 0 & 0 & 0 & 1 & 0 & 0 & 1 & 1 \\ 1 & 0 & 1 & 1 & 0 & 0 & 1 & 0 & 0 & 0 & 0 & 0 & 0 & 0 & 1 & 0 & 0 & 1 \\ 1 & 1 & 1 & 1 & 1 & 1 & 1 & 0 & 0 & 0 & 0 & 0 & 0 & 0 & 0 & 1 & 1 & 1. \end{array} \quad (3)$$

Notice that columns 7–15 of $H_2$ form a 9×9 identity matrix. The value of each check bit is calculated from a row vector of $H_2$. Let $C=(c_0, c_1, c_2, \ldots, c_{17})$ be a code word. Since for a properly formed code word C, $CH_2^t=0$, each row of $H_2$ is in effect a statement that the XOR sum of a given check bit and the data bits indicated by the ones in the row is zero or, equivalently, that the check bit is the XOR sum of those data bits. Given the values of bits 0–6 and bits 16–17 in the code word, the values of bits 7–15 are calculated from the following responding to the rows of $H_2$) in terms of exclusive OR operations:

$c_7$=XOR of bits 1, 3, 4, 16, 17

$c_8$=XOR of bits 0, 2, 4, 5, 17

$c_9$=XOR of bits 1, 3, 5, 6, 17

$c_{10}$=XOR of bits 2, 4, 6, 16, 17

$c_{11}$=XOR of bits 0, 3, 5, 16, 17

$c_{12}$=XOR of bits 0, 1, 4, 6, 17

$c_{13}$=XOR of bits 1, 2, 5, 16, 17

$c_{14}$=XOR of bits 0, 2, 3, 6, 17

$c_{15}$=XOR of bits 0, 1, 2, 3, 4, 5, 6, 16, 17. (4)

To calculate the check bits above, it is not necessary to obtain an explicit value for a generator matrix G. However, it can readily be shown (see, e.g., chapter 3 of the Peterson et al. reference identified above) that matrix $H_2$ is a parity check matrix for a code having the following a generator matrix G:

$$\begin{matrix}
1 & 0 & 0 & 0 & 0 & 0 & 0 & 0 & 1 & 0 & 0 & 1 & 1 & 0 & 1 & 1 & 0 & 0 \\
0 & 1 & 0 & 0 & 0 & 0 & 0 & 0 & 1 & 0 & 1 & 0 & 0 & 1 & 1 & 0 & 1 & 0 & 0 \\
0 & 0 & 1 & 0 & 0 & 0 & 0 & 0 & 1 & 0 & 1 & 0 & 0 & 1 & 1 & 1 & 0 & 0 \\
0 & 0 & 0 & 1 & 0 & 0 & 0 & 1 & 0 & 1 & 0 & 1 & 0 & 0 & 1 & 1 & 0 & 0 \\
0 & 0 & 0 & 0 & 1 & 0 & 0 & 1 & 1 & 0 & 1 & 0 & 1 & 0 & 0 & 1 & 0 & 0 \\
0 & 0 & 0 & 0 & 0 & 1 & 0 & 0 & 1 & 1 & 0 & 1 & 0 & 1 & 0 & 1 & 0 & 0 \\
0 & 0 & 0 & 0 & 0 & 0 & 1 & 0 & 0 & 1 & 1 & 0 & 1 & 0 & 1 & 1 & 0 & 0 \\
0 & 0 & 0 & 0 & 0 & 0 & 0 & 1 & 0 & 0 & 1 & 1 & 0 & 1 & 0 & 1 & 1 & 0 \\
0 & 0 & 0 & 0 & 0 & 0 & 0 & 1 & 1 & 1 & 1 & 1 & 1 & 1 & 1 & 0 & 1
\end{matrix}$$

Columns 0–6 and 16–17 of G form an identity matrix, while columns 7–15 form the transpose of the matrix formed by columns 0–6 and 7–15 of $H_2$. Since columns 0–6 and 16–17 of G form an identity matrix, bits 0–6 and 16–17 of a code word C are simply the corresponding bits of the original data word (hence their label as information bits). Check bits 7–15 may alternatively be calculated using columns 7–15 of generator matrix G (with the bits SPUE and AP being regarded as bits 7 and 8 of the original data word). Since columns 7–15 of G are simply the transpose of the matrix formed by columns 0–6 and 7–15 of $H_2$, the resulting XOR operations are identical to the operations (4) set forth above.

As described earlier, the syndrome S of a received vector R is used in the decoding to determine the nature of the errors if S is not zero. Let sp be the parity of the syndrome bits. That is, sp is the XOR of all 9 syndrome bits. Since each column of the parity check matrix $H_1$ contains an odd number of ones, an error in any one bit of the received vector R will invert (i.e., flip) an odd number of syndrome bits, thereby inverting their XOR sum sp. Accordingly, sp=0 if there is an even number of errors in R, and sp=1 if there is an odd number of errors in R. Thus, the decoder can easily determine whether the number of errors is even or odd. If the number of errors is odd, the decoder assumes that there is one error and it goes on to determine the single error position. On other hand, if the number of errors is even, the decoder assumes that there are two errors and it goes on to determine the locations of two errors.

Single error position is relatively easy to determine. If the first 8 bits of column i of $H_1$ are identical to the first 8 syndrome bits, then bit i is identified as the single error location.

Double error positions are not trivial to identify. An equation with the error locations as unknown variables has to be derived and solved. Let $x_1$ and $x_2$ be two unknown variables representing the error locations in terms of the finite field of 256 elements. Each variable is either a power of β or 0. Let $S_1$ be the first 8 bits of the syndrome and consider $S_1$ as an element of the finite field. From the first row of matrix H and the equation $HC^t$=0, the syndrome is related to the error locations $x_1$ and $x_2$ by the equation $S_1 = x_1 + x_2$. In addition, it can be shown that error locations $x_1$ and $x_2$ are roots of $x^{18} - x$. That is, $x_1^{18} - x_1 = 0$ and $x_2^{18} - x_2 = 0$. Combining all these relations, it can be shown that $x_1$ and $x_2$ are solutions to the following equation with x as the unknown variable.

$$S_1^{17} = x^{16} S_1 + x S_1^{16} \quad (5)$$

The values of $x_1$ and $x_2$ are obtained by solving equation (5) for x. Special attention is required in the case that one of the two errors is located at bit 15, which has a 0 as the field element in matrix H. In this case, equation (5) is not used. Instead, $S_1$ is treated as a single error syndrome, and the second error location is identified by matching $S_1$ with the column vectors of the first 8 rows of $H_1$.

Let $E_i$ be the error indicator for bit i with the property that $E_i$=0 if bit i is not in error and $E_i$=1 if bit i is in error. The decoder is used to generate the values of $E_i$ for all bit positions. One decoding algorithm (Algorithm A) is described below:

1. If all 9-syndrome bits are zero, there is no error and the received data is not altered. Exit the algorithm.
2. Set $E_{15}$=1 if (a) $S_1$=0 and sp=1; or (b) $S_1^{17}$=1 and sp=0, where $S_1$ is the first 8 bits of the syndrome S and is considered a field element, and sp is the exclusive OR sum of all syndrome bits.
3. For $0 \leq i \leq 17$ and $i \neq 15$: set $E_i$=1 if (a) $S_1$=column i of the first 8 rows of $H_1$ and $S_1^{17}$=1; or (b) the field element $x_i$ of column i of the first 8 rows of $H_1$ satisfies $x_i^{16} S + x_i S_1^{16} = S_1^{17}$, $S_1^{17} \neq 1$, $S_1 \neq 0$, and sp=0.
4. Set UE=1 if (a) $S_1^{17} \neq 1$, $S_1 \neq 0$ and sp=1; or (b) $S_1^{17} \neq 1$, sp=0 and there is no solution to $x_i^{16} S_1 + x_i S_1^{16} = S_1^{17}$.

If the value of $E_{16}$ obtained from Algorithm A is 1, the received data R is a SPUE. In this case, the data bits in bits 0–6 after error correction are used to determine the nature of the SPUE, which results in failure isolation.

The components of the 8-bit vector $S_1^{17}$ are not independent. It can be shown that bits 0, 1, 2, and 4 are linearly independent and that the remaining 4 bits can be derived from these independent bits. (More generally, the exact positions of the independent bits depend on the polynomial defining the field, but the number of independent bits is always 4.) Thus, $S_1^{17}$ can be replaced by $S_1^{17}(0, 1, 2, 4)$, which represents bits 0, 1, 2, 4 of $S_1^{17}$ in Algorithm A. These 4 bits can be obtained from the following formulas:

$S_1^{17}(0)$=XOR of $S(0)$, $S(2)$, $S(3)$, $S(6)$, $S(0)S(1)$, $S(0)$
$S(5)$, $S(0)S(7)$, $S(1)S(2)$, $S(1)S(6)$, $S(1)S(7)$, $S(2)$
$S(4)$, $S(2)S(6)$, $S(3)S(6)$, $S(3)S(7)$, $S(4)S(5)$, $S(4)$
$S(7)$ $S_1^{17}(1)$=XOR of $S(1)$, $S(3)$, $S(4)$, $S(7)$, $S(0)S(2)$, $S(0)$
$S(3)$, $S(0)S(6)$, $S(1)S(2)$, $S(1)S(6)$, $S(2)S(3)$, $S(2)$
$S(7)$, $S(3)S(5)$, $S(3)S(7)$, $S(4)S(7)$, $S(5)S(6)$ $S_1^{17}(2)$=XOR of $S(1)$, $S(2)$, $S(5)$, $S(0)S(1)$, $S(0)S(5)$,
$S(0)S(6)$, $S(0)S(7)$, $S(1)S(3)$, $S(1)S(5)$, $S(2)S(5)$,
$S(2)S(6)$, $S(3)S(4)$, $S(3)S(6)$, $S(3)S(7)$, $S(4)S(7)$,
$S(5)S(7)$ $S_1^{17}(4)$=XOR of $S(1)$, $S(2)$, $S(3)$, $S(4)$, $S(6)$, $S(0)S(1)$,
$S(0)S(2)$, $S(0)S(4)$, $S(0)S(5)$, $S(1)S(2)$, $S(1)S(4)$,
$S(1)S(5)$, $S(1)S(6)$, $S(2)S(3)$, $S(2)S(4)$, $S(2)S(5)$,
$S(2)$, $S(4)S(5)$, $S(4)S(6)$, $S(5)S(7)$, $S(6)S(7)$ (6)

In equation (6), S(i) denotes bit i of the syndrome S and S(i)S(j) is the product of S(i) and S(j).

One embodiment of the hardware implementation of the ECC encoding and decoding is described next.

Figure 3A:
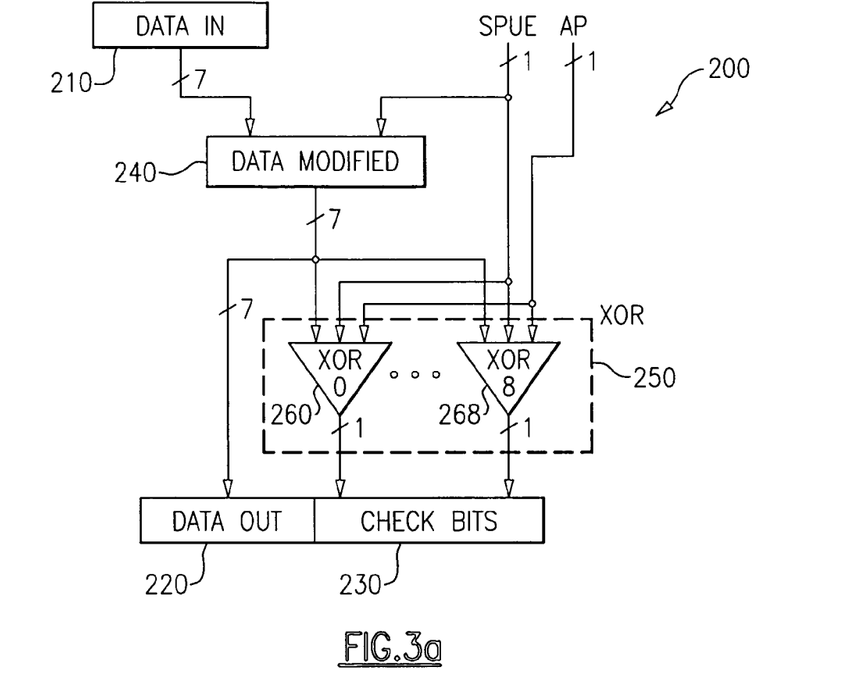
FIG. 3a illustrates one example of a circuit used to generate a plurality of check bits associated with the data inputs in accordance with the present invention
Figure 3B:
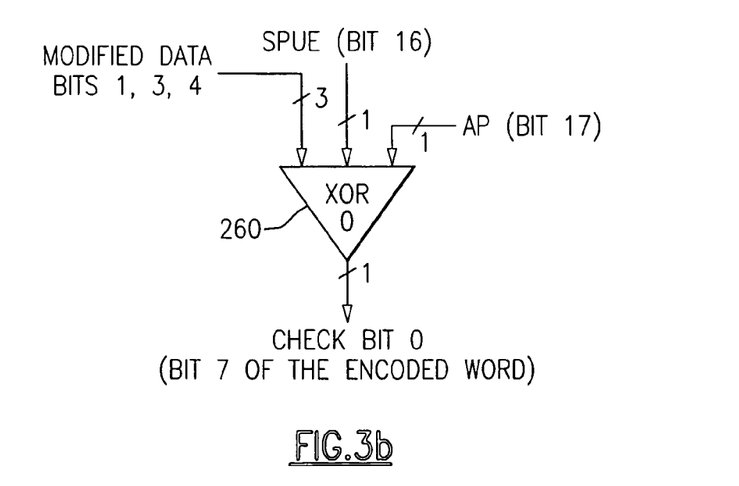
FIG. 3b illustrates one example of a portion of the circuit of FIG. 3a used to generate a single check bit.

FIG. 3a shows an encoder 200 for ECC encoding. Input data (DATA IN) 210 consists of the 7-bit storage protection key data to be encoded. Two other inputs to the encoder 200 are the special uncorrectable error bit SPUE and the memory address parity bit AP shown in FIG. 2. The key data 210 is sent to a modification circuit (DATA MODIFIED) 240 that has SPUE as the other input. If SPUE is 0, the key data 210 is not modified. On the other hand, if SPUE is 1, circuit 240 modifies the key data 210 according to the pre-defined SPUE data patterns as described above. The output of circuit 240 appears as output data (DATA OUT) 220. It is also sent to a check symbol generator 250 comprising an XOR gate array containing XOR circuits 260–268 (XOR0–XOR8). XOR circuits 260–268 generate check bits according to equation (4). Thus, FIG. 3b illustrates the generation of check bit 0 (bit 7 of the encoded word) using XOR circuit 260 according to equation (4).

The output of the XOR gate array 250 appears as check bits 230. Bits 0–15 of the encoded ECC word (bits 0–17) consist of the output data 220 (bits 0–6) and check bits 230 (bits 7–15). As noted above, bits 0–15 of the code word are stored in memory 110, while bit 16 (SPUE) is assumed to be zero and bit 17 (AP) of the code word is independently regenerated when bits 0–15 of the code word are later read out of the memory 110.

Figure 4:
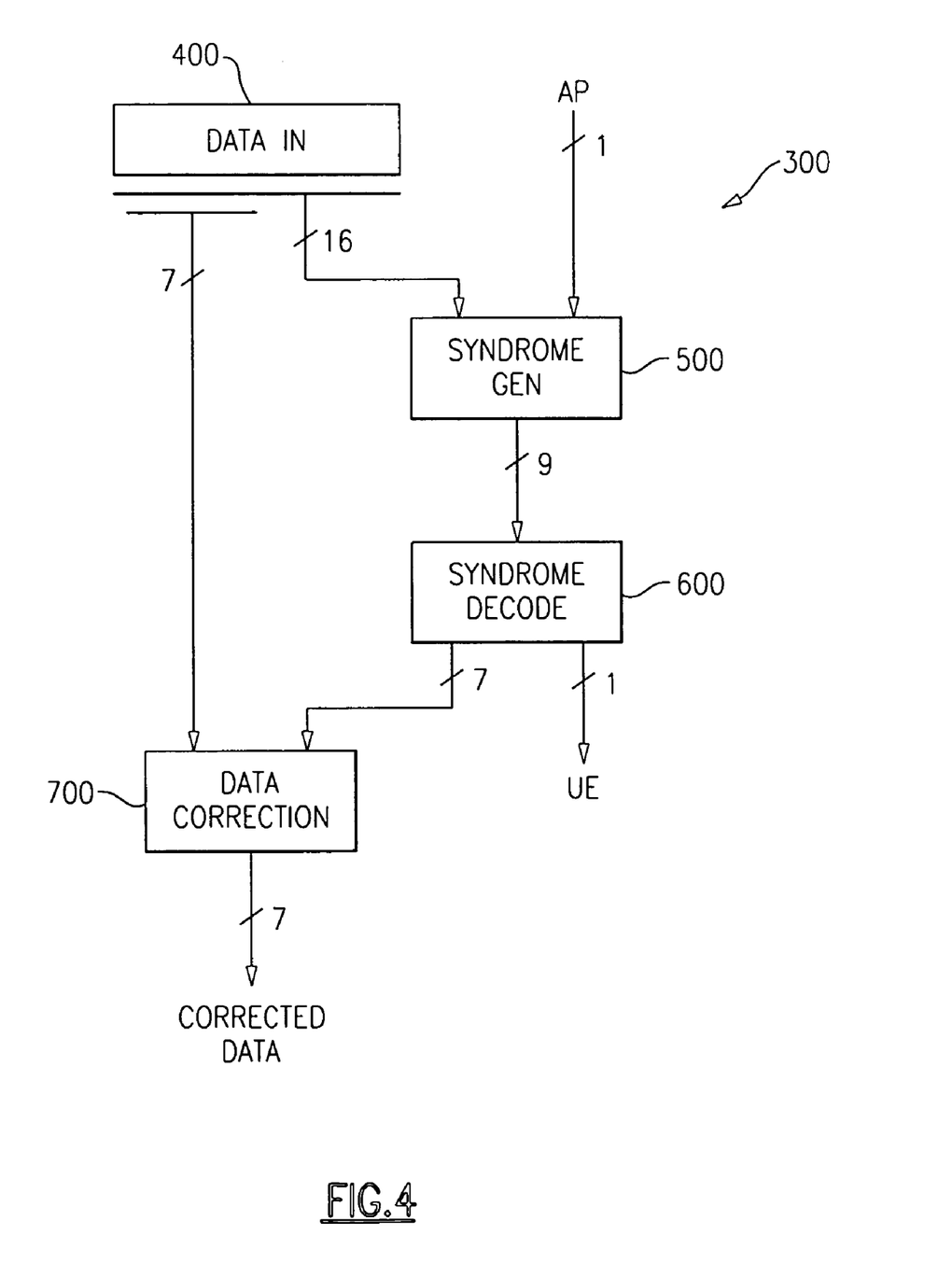
FIG. 4 illustrates one example of an error correction and error detection system for the received data in accordance to the present invention.

FIG. 4 is a block diagram of a decoder 300 for data read from memory 110. The received 16-bit word is stored in an input register (DATA IN) 400, of which the first 7 bits represent the data bits and the last 9 bits represent the check bits. The entire 16-bit word in input register 400 is sent to a syndrome generator (SYNDROME GEN) 500 that has the address parity bit AP as another input. (Since SPUE information is not available, it is assumed to be zero.) Syndrome generator 500 generates as an output all 9 syndrome bits, which are sent to a syndrome decoder (SYNDROME DECODE) 600 for the generation of error location indicators $E_i$ and a one-bit uncorrectable error indicator UE. The error indicators $E_i$ for $0 \leq i \leq 6$ from syndrome decoder 600 and the 7 data bits from input register 400 are XORed bitwise by a data correction circuit 700 to produce corrected output data.

Figure 5A:
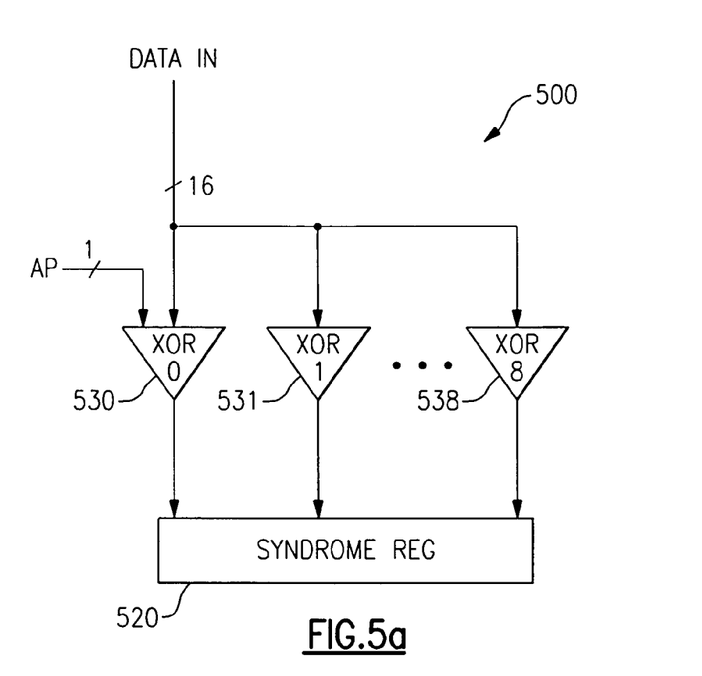
FIG. 5a illustrates one example of a circuit used to generate a plurality of syndrome bits associated with the data inputs in accordance with the present invention.

FIG. 5a shows the syndrome generator 500. The inputs are the 16 received bits—7 data bits (0–6) and 9 check bits (7–15)—stored in input register 400 and the AP bit (17). The 9-bit output is stored in a syndrome register (SYNDROME REG) 520. The 9 syndrome bits are generated by XOR blocks 530–538, each of which contains logic for performing an XOR operation specified in equation (2).

Figure 5B:
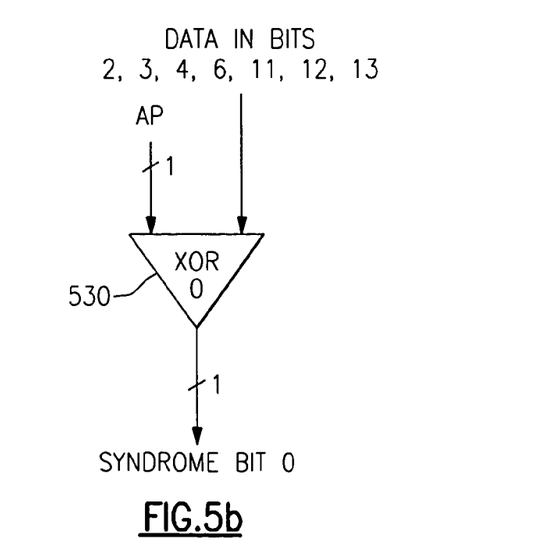
FIG. 5b illustrates one example of a portion of the circuit of FIG. 5a used to generate a single syndrome bit.

FIG. 5b shows, by way of illustration, the input bits (2–4, 6, 11–13, AP=17) for XOR block 530, which generates syndrome bit 0. Notice that bit 17 appears only once in equation (2); only XOR block 530 takes AP as an input.

Figure 6:
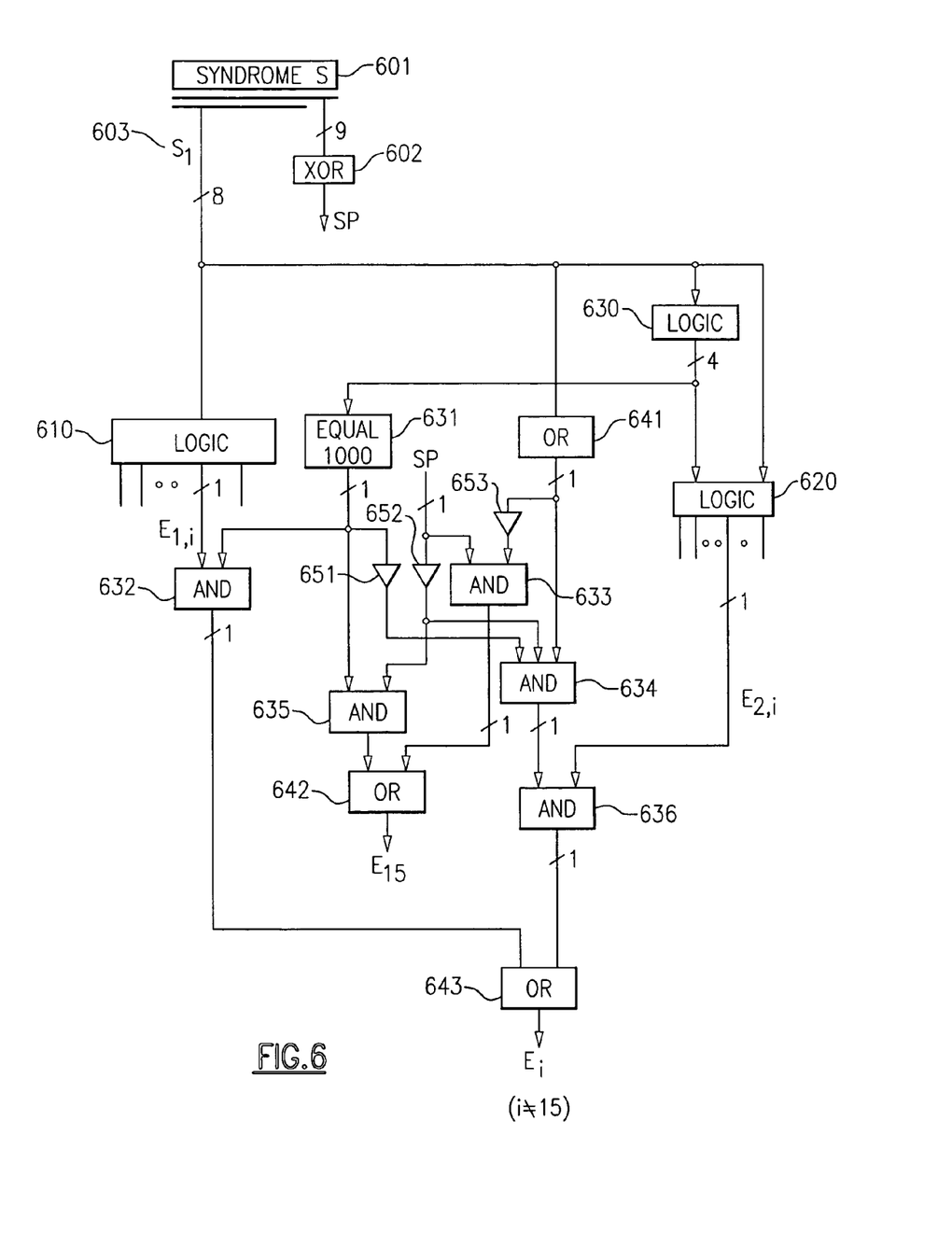
FIG. 6 illustrates one example of a circuit used to generate error location indicators in accordance to the present invention.

FIG. 6 shows the syndrome decoder 600, which generates the error indicator $E_{15}$ as well as error indicators $E_i$ for $i \neq 15$ in accordance with steps 2 and 3, respectively, of Algorithm A. Although not shown in FIG. 6, syndrome decoder 600 also contains uncorrectable error (UE) detection logic 660 (FIG. 8) for generating an uncorrectable error (UE) signal indicating the presence of an uncorrectable error. In this figure, for $i \neq 15$, $E_{1,i}=1$ indicates that $S_1$=column i of the first 8 rows of $H_1$, while $E_{2,i}=1$ indicates that the field element $x_i$ of column i of the first 8 rows of $H_1$ satisfies the equation $x_i^{16}S+x_i S_1^{16}=S_1^{17}$. Each AND block 632–636 outputs the logical AND of its inputs, while each OR block 641–643 outputs the logical OR of its inputs and each inverter block 651–653 (denoted by a triangle) outputs the logical inverse of its input. A syndrome parity bit sp is generated by an XOR circuit 602 that outputs the exclusive OR of all 9 syndrome bits, stored in a syndrome register (SYNDROME S) 601. Also, a vector $S_1$ (603) is extracted as the first 8 bits of the syndrome vector S.

Figure 7:
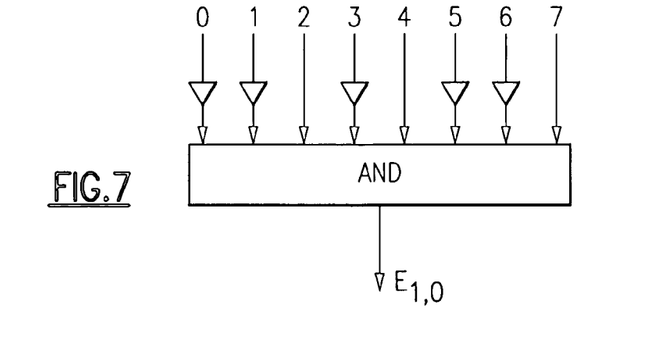
FIG. 7 illustrates one example of a portion of the circuit in FIG. 6 used to generate a preliminary single error location indicator.

Single error location logic 610 performs the function of matching input $S_1$ (603) with the column vectors of the first 8 rows of $H_1$ of equation (1). The output bits are single error indicators $E_{1,i}$. FIG. 7 illustrates by way of example the circuit for generating the single error indicator $E_{1,0}$. (The triangles in the figure denote logical inverters.) The circuit matches an 8-bit input (0–7) with column 0 of the first 8 rows of $H_1$ to produce an output $E_{1,0}$ of 1 if and only if each input bit matches the corresponding bit of that column of $H_1$.

Logic 630 in FIG. 6 generates as the output $S_1^{17}(0, 1, 2, 4)$ for bits 0, 1, 2, and 4 of $S_1^{17}$ according to equation (6). This generated output is used to represent $S_1^{17}$.

Double error location logic 620 generates the double error indicators $E_{2,i}$. The inputs to logic 620 include $S_1^{17}(0, 1, 2, 4)$ from logic 630 and $S_1$ (603). The outputs $E_{2,i}$ of logic 620 are generated as follows. Logic 620 first generates a set of comparison bits Fi from syndrome bits 0–7 according to the following formulas:

F1=syndrome bit 7,

F3=XOR of syndrome bits 6, 7,

F4=syndrome bit 5,

F14=XOR of syndrome bits 4, 5, 6,

F18=XOR of syndrome bits 3, 6,

F20=XOR of syndrome bits 3, 5,

F21=XOR of syndrome bits 3, 5, 7,

F23=XOR of syndrome bits 3, 5, 6, 7,

F26=XOR of syndrome bits 3, 4, 6,

F29=XOR of syndrome bits 3, 4, 5, 7,

F30=XOR of syndrome bits 3, 4, 5, 6,

F40=XOR of syndrome bits 2, 4,

F42=XOR of syndrome bits 2, 4, 6,

F44=XOR of syndrome bits 2, 4, 5,

F45=XOR of syndrome bits 2, 4, 5, 7,

F49=XOR of syndrome bits 2, 3, 7,

F50=XOR of syndrome bits 2, 3, 6,

F52=XOR of syndrome bits 2, 3, 5,

F58=XOR of syndrome bits 2, 3, 4, 6,

F69=XOR of syndrome bits 1, 5, 7,

F71=XOR of syndrome bits 1, 5, 6, 7,

F74=XOR of syndrome bits 1, 4, 6,

F85=XOR of syndrome bits 1, 3, 5, 7,

F86=XOR of syndrome bits 1, 3, 5, 6,

F89=XOR of syndrome bits 1, 3, 4, 7,

F96=XOR of syndrome bits 1, 2,

F98=XOR of syndrome bits 1, 2, 6,

F107=XOR of syndrome bits 1, 2, 4, 6, 7,

F108=XOR of syndrome bits 1, 2, 4, 5,

F123=XOR of syndrome bits 1, 2, 3, 4, 6, 7,

F130=XOR of syndrome bits 0, 6,

F131=XOR of syndrome bits 0, 6, 7,

F135=XOR of syndrome bits 0, 5, 6, 7,

F137=XOR of syndrome bits 0, 4, 7,

F139=XOR of syndrome bits 0, 4, 6, 7,

F142=XOR of syndrome bits 0, 4, 5, 6,

F143=XOR of syndrome bits 0, 4, 5, 6, 7,

F145=XOR of syndrome bits 0, 3, 7,

F148=XOR of syndrome bits 0, 3, 5,

F160=XOR of syndrome bits 0, 2,

F162=XOR of syndrome bits 0, 2, 6,

F168=XOR of syndrome bits 0, 2, 4,

F177=XOR of syndrome bits 0, 2, 3, 7,

F178=XOR of syndrome bits 0, 2, 3, 6,

F180=XOR of syndrome bits 0, 2, 3, 5,

F182=XOR of syndrome bits 0, 2, 3, 5, 6,

F183=XOR of syndrome bits 0, 2, 3, 5, 6, 7,

F184=XOR of syndrome bits 0, 2, 3, 4,

F190=XOR of syndrome bits 0, 2, 3, 4, 5, 6,

F192=XOR of syndrome bits 0, 1,

F198=XOR of syndrome bits 0, 1, 5, 6,

F199=XOR of syndrome bits 0, 1, 5, 6, 7,

F202=XOR of syndrome bits 0, 1, 4, 6,

F203=XOR of syndrome bits 0, 1, 4, 6, 7,

F204=XOR of syndrome bits 0, 1, 4, 5,

F206=XOR of syndrome bits 0, 1, 4, 5, 6,

F209=XOR of syndrome bits 0, 1, 3, 7,

F210=XOR of syndrome bits 0, 1, 3, 6,

F213=XOR of syndrome bits 0, 1, 3, 5, 7,

F215=XOR of syndrome bits 0, 1, 3, 5, 6, 7,

F223=XOR of syndrome bits 0, 1, 3, 4, 5, 6, 7,

F226=XOR of syndrome bits 0, 1, 2, 6,

F232=XOR of syndrome bits 0, 1, 2, 4,

F234=XOR of syndrome bits 0, 1, 2, 4, 6,

F237=XOR of syndrome bits 0, 1, 2, 4, 5, 7,

F240=XOR of syndrome bits 0, 1, 2, 3,

F247=XOR of syndrome bits 0, 1, 2, 3, 5, 6, 7,

F251=XOR of syndrome bits 0, 1, 2, 3, 4, 6, 7,

Note that the syndrome bits participating in the XOR operations for $F_i$ correspond to the binary representation of the integer i. For example, the binary representation of 226 is 11100010, and F226 is the XOR of syndrome bits 0, 1, 2, 6.

Logic 620 then generates a set of error values $E_{2,j}$ for $0 \leq j \leq 17$ and $j \neq 15$ by comparing the bits of $S_1^{17}(0, 1, 2, 4)$ with selected bits Fi, as indicated below. Each generated error value $E_{2,j}$ is one if the bits all match and is otherwise zero. More particularly:

$E_{2,0}=1$ if $S_1^{17}(0, 1, 2, 4)=(F183, F232, F139, F29)$ $E_{2,1}=1$ if $S_1^{17}(0, 1, 2, 4)=(F26, F251, F123, F18)$ $E_{2,2}=1$ if $S_1^{17}(0, 1, 2, 4)=(F44, F168, F199, F23)$ $E_{2,3}=1$ if $S_1^{17}(0, 1, 2, 4)=(F237, F206, F107, F3)$ $E_{2,4}=1$ if $S_1^{17}(0, 1, 2, 4)=(F192, F180, F137, F4)$ $E_{2,5}=1$ if $S_1^{17}(0, 1, 2, 4)=(F49, F203, F14, F85)$ $E_{2,6}=1$ if $S_1^{17}(0, 1, 2, 4)=(F30, F198, F30, F98)$ $E_{2,7}=1$ if $S_1^{17}(0, 1, 2, 4)=(F202, F184, F20, F213)$ $E_{2,8}=1$ if $S_1^{17}(0, 1, 2, 4)=(F226, F45, F42, F178)$ $E_{2,9}=1$ if $S_1^{17}(0, 1, 2, 4)=(F160, F135, F223, F142)$ $E_{2,10}=1$ if $S_1^{17}(0, 1, 2, 4)=(F58, F21, F182, F148)$ $E_{2,11}=1$ if $S_1^{17}(0, 1, 2, 4)=(F209, F145, F74, F215)$ $E_{2,12}=1$ if $S_1^{17}(0, 1, 2, 4)=(F210, F52, F1, F247)$ $E_{2,13}=1$ if $S_1^{17}(0, 1, 2, 4)=(F162, F240, F177, F190)$ $E_{2,14}=1$ if $S_1^{17}(0, 1, 2, 4)=(F86, F96, F234, F143)$ $E_{2,16}=1$ if $S_1^{17}(0, 1, 2, 4)=(F131, F204, F89, F40)$ $E_{2,17}=1$ if $S_1^{17}(0, 1, 2, 4)=(F69, F50, F71, F108)$.

Syndrome decoder 600 combines the outputs of single error location logic 610 and double error location logic 620 to generate an error locator bit $E_i$ for each bit i, where $0 \leq i \leq 17$, in accordance with steps 2 and 3 of algorithm A. To accomplish this, a gate array 631 responsive to logic 630 produces a output of one whenever $S_1^{17}=1$, that is, if $S_1^{17}(0, 1, 2, 4)=(1, 0, 0, 0)$. Also, an OR gate 641 produces a zero whenever $S_1=0$, that is, whenever the first eight bits of the syndrome vector S are all zero.

For i=15, in step 2 of the algorithm, if $S_1=0$ and sp=1, then both inputs to AND gate 633 are one, causing OR gate 642 to output a one to generate an $E_{15}$ locator bit. Similarly, if $S_1^{17}=1$ sp=0, then both inputs to AND gate 635 are one, against causing OR gate 642 to output a one to generate an $E_{15}$ locator bit. In the first instance, the $E_{15}$ locator bit indicates a single error at bit location 15, while in the second, the $E_{15}$ locator bit indicates a double error involving bit 15 and one other bit location (as indicated by another $E_i$).

For $0 \leq i \leq 17$ and $i \neq 15$, in step 3 of the algorithm, if $S_1$=column i of the first 8 rows of $H_1$ and $S_1^{17}=1$, then logic 610 ($E_{1,i}$) and logic 631 input ones to the AND gate 632 for the particular i, causing the OR gate 643 for the particular i to generate an $E_i$ locator bit, this time for a single error at bit location i. Similarly, if the field element $x_i$ of column i of the first 8 rows of $H_1$ satisfies the equation $x_i^{16} S + x_i S_1^{16} = S_1^{17}$, then logic 620 ($E_{2,i}$) and AND gate 634 input ones to the AND gate 636 for the particular i, again causing the OR gate 643 for the particular i to generate an $E_i$ locator bit, this time for a double error at bit location i and one other location (as indicated by another $E_i$).

Figure 8:
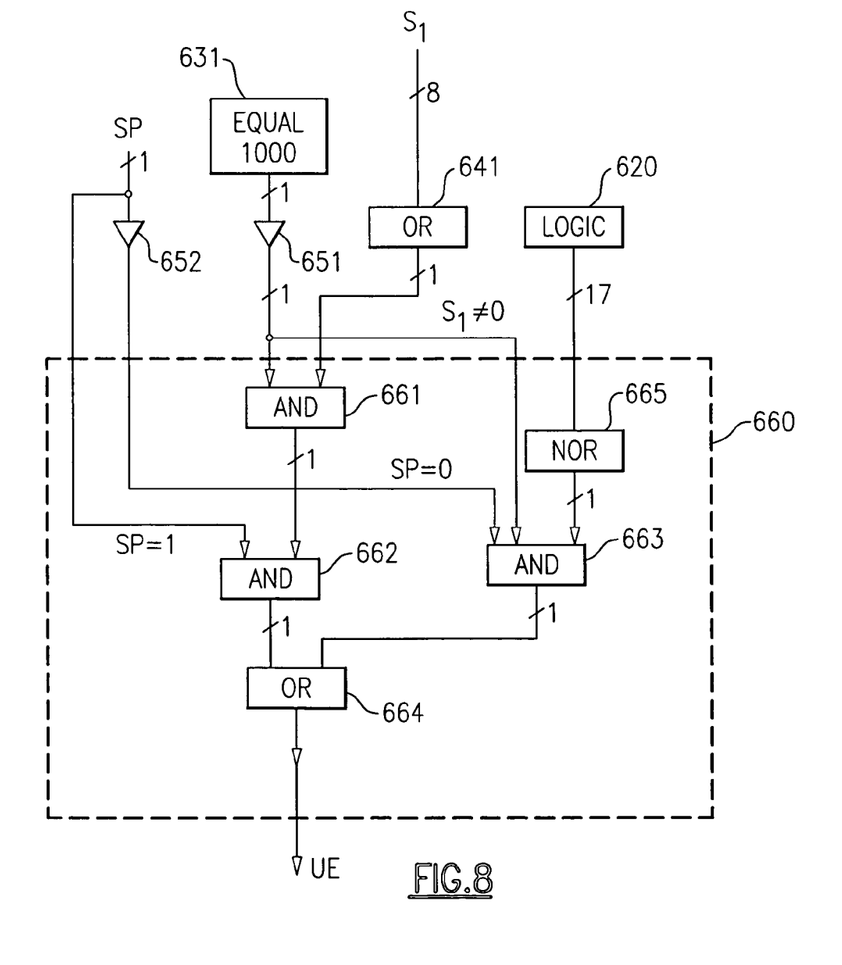
FIG. 8 illustrates one example of a circuit used to generate uncorrectable error signal in accordance to the present invention.

FIG. 8 shows uncorrectable error (UE) detection logic 660 for generating the uncorrectable error (UE) signal (FIG. 4). UE detection logic 660 is a part of syndrome decoder 600. Each of the AND blocks 661, 662, and 663 outputs the logical AND of its inputs and each of the OR blocks 664 outputs the logical OR of its inputs. NOR 665 outputs the inverse of the logical OR of the inputs $E_{2,i}$ from the output of logic 620.

UE detection logic 660 implements in hardware step 4 of Algorithm A. Thus, if (1) $S_1^{17} \neq 1$, (2) $S_1 \neq 0$ and (3) sp=1, then (1) circuit 631 outputs a zero to inverter 651, inverter to supply a first one to AND gate 661, (2) OR gate 641 supplies a second one to AND gate 661, causing that gate to supply a first one to AND gate 662, and (3) the sp line supplies a second one to AND gate 662; all of this causes AND gate 662 to input a one to OR gate 664, resulting in a one on the UE line. Alternatively, if (1) $S_1^{17} \neq 1$, (2) sp=0 and (3) there is no solution to the equation $x_i^{16} S_1 + x_i S_1^{16=S}{}_1^{17}$, then (1) circuit 631 outputs a zero to inverter 651 causing that inverter to supply a first one to AND gate 663, (2) the sp line supplies a zero to inverter 652, causing that inverter to supply a second one to AND gate 663, and (3) logic 620 supplies all zeros to NOR gate 665, causing that gate to output a third one to AND gate 663; all of this causes AND gate 663 to input a one to OR gate 664, likewise resulting in a one on the UE line.

If (as shown in FIG. 4) errors in the check bits (7–15) are not corrected, the associated error locators need not be generated for this purpose. In such case, the circuits in single error location logic 610 for generating $E_{1,i}$ for $7 \leq i \leq 14$, as well as the circuits for generating $E_{15}$, may be omitted. On the other hand, since step 4 of Algorithm A involves all 17 $E_{2,i}$ values ($0 \leq i \leq 17$, $i \neq 15$), it is still necessary for double error location logic 620 to generate all of these $E_{2,i}$ values for UE detection logic 660 to fully implement this step of the algorithm. If the $E_{2,i}$ values for $7 \leq i \leq 14$ are not generated in logic 620, then the UE detection is reduced to determining whether $S^{17} \neq 1$, $S \neq 0$ and sp=1. The decoder 300 still provides double error correcting and triple error detecting ability. However, it does not detect as many errors beyond triple errors as the full decoder. Note also that if logic 620 does generate $E_{2,i}$ values for $7 \leq i \leq 14$, the number of Fi XOR functions is reduced from 68 to 36. Thus, the overall syndrome decoding circuitry would be reduced nearly by half, but at the expense of reducing the probability of detecting four or more errors.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. In an information handling system in which a data word that is susceptible to a plurality of types of special uncorrectable errors that are known at the time of encoding is encoded using an error correction code to generate a code word, the data word containing a plurality of regular data symbols that are used to encode data in the absence of a special uncorrectable error, a method for encoding such special uncorrectable errors, comprising the steps of:

modifying the regular data symbols in response to an indication at the time of encoding of a special uncorrectable error to indicate the type of special uncorrectable error;

appending to the regular data symbols a special uncorrectable error symbol encoding the indication of a special uncorrectable error to form an extended data word; and encoding the extended data word to generate a code word.

2. The method of claim 1 in which the regular data symbols and the uncorrectable error symbol are bits.

3. The method of claim 1 in which the extended data word also contains an address parity symbol indicating the parity of a memory address in which the data is stored.

4. The method of claim 1 in which the step of generating the code word comprises the steps of:

generating one or more check symbols as a function of the symbols of the extended data word; and appending the check symbols to the extended data word to form the code word.

5. The method of claim 1, comprising the further step of:

decoding the code word to regenerate the special uncorrectable error symbol and the modified regular data symbols.

6. The method of claim 5 in which the decoding step comprises the steps of:

decoding the code word using a predetermined value for the special uncorrectable error symbol indicating the absence of a special uncorrectable error; and detecting the presence of an error in the predetermined value of the special uncorrectable error symbol to regenerate the special uncorrectable error symbol.

7. A program storage device readable by a machine, tangibly embodying a program of instructions executable by the machine to perform the method steps of claim 6.

8. A program storage device readable by a machine, tangibly embodying a program of instructions executable by the machine to perform the method steps of claim 1.

9. In an information handling system in which a data word that is susceptible to a special uncorrectable error that is known at the time of encodine is encoded using an error correction code to generate a code word, the data word containing a plurality of regular data symbols that are used to encode data in the absence of a special uncorrectable error and a special uncorrectable error symbol, the special uncorrectable error symbol indicating the absence of a special uncorrectable error with a predetermined first value and indicating the presence of a special uncorrectable error with a predetermined second value, a method for decoding the code word to detect the presence of a special uncorrectable error, comprising the steps of:

generating a syndrome vector from the code word using the predetermined first value for the special uncorrectable error symbol indicating the absence of a special uncorrectable error; and detecting the presence of an error in the predetermined first value of the special uncorrectable error symbol from the syndrome vector to detect the presence of a special uncorrectable error.

10. A program storage device readable by a machine, tangibly embodying a program of instructions executable by the machine to perform the method steps of claim 9.

11. In an information handling system in which a data word that is susceptible to a plurality of types of special uncorrectable errors that are known at the time of encoding is encoded using an error correction code to generate a code word, the data word containing a plurality of regular data symbols that are used to encode data in the absence of a special uncorrectable error, apparatus for encoding such special uncorrectable errors, comprising:

modification logic responsive to an indication at the time of encoding of a special uncorrectable error for modifying the regular data symbols to indicate the type of special uncorrectable error; and an encoder for appending to the regular data symbols a special uncorrectable error symbol encoding the indication of a special uncorrectable error to form an extended data word and for encoding the extended data word to generate a code word.

12. The apparatus of claim 11 in which the regular data symbols and the uncorrectable error symbol are bits.

13. The apparatus of claim 11 in which the extended data word also contains an address parity symbol indicating the parity of a memory address in which the data is stored.

14. The apparatus of claim 11 in which the encoder comprises:

a check symbol generator for generating one or more check symbols as a function of the symbols of the extended data word and for appending the check symbols to the extended data word to form the code word.

15. The apparatus of claim 11, further comprising:

a decoder for decoding the code word to regenerate the special uncorrectable error symbol and the modified regular data symbols.

16. The apparatus of claim 15 in which the decoder comprises:

a syndrome generator for generating a syndrome vector from the code word using a predetermined value for the special uncorrectable error symbol indicating the absence of a special uncorrectable error; and a syndrome decoder for detecting the presence of an error in the predetermined value of the special uncorrectable error symbol from the syndrome vector to regenerate the special uncorrectable error symbol.

17. In an information handling system in which a data word that is susceptible to a special uncorrectable error that is known at the time of encoding is encoded using an error correction code to generate a code word, the data word containing a plurality of regular data symbols that are used to encode data in the absence of a special uncorrectable error and a special uncorrectable error symbol, the special uncorrectable error symbol indicating the absence of a special uncorrectable error with a predetermined first value and indicating the presence of a special uncorrectable error with a predetermined second value, apparatus for decoding the code word to detect the presence of a special uncorrectable error, comprising:

a syndrome generator for generating a syndrome vector from the code word using the predetermined first value for the special uncorrectable error symbol indicating the absence of a special uncorrectable error; and a syndrome decoder for detecting the presence of an error in the predetermined first value of the special uncorrectable error symbol from the syndrome vector to detect the presence of a special uncorrectable error.

* * * * *